(12) United States Patent
Yamamoto

(10) Patent No.: US 9,355,852 B2
(45) Date of Patent: May 31, 2016

(54) METHOD FOR MANUFACTURING SEMICONDUCTOR DEVICE

(71) Applicant: Mitsubishi Electric Corporation, Tokyo (JP)

(72) Inventor: Takahiro Yamamoto, Tokyo (JP)

(73) Assignee: MITSUBISH ELECTRIC CORPORATION, Tokyo (JP)

( * ) Notice: Subject to any disclaimer, the term of this patent is extended or adjusted under 35 U.S.C. 154(b) by 57 days.

(21) Appl. No.: 14/225,510

(22) Filed: Mar. 26, 2014

(65) Prior Publication Data

US 2015/0017790 A1    Jan. 15, 2015

(30) Foreign Application Priority Data

Jul. 11, 2013 (JP) .................................. 2013-145643

(51) Int. Cl.
*H01L 21/304* (2006.01)
*H01L 21/02* (2006.01)
*H01L 33/00* (2010.01)

(52) U.S. Cl.
CPC ........... *H01L 21/304* (2013.01); *H01L 21/0254* (2013.01); *H01L 21/02381* (2013.01); *H01L 21/02428* (2013.01); *H01L 33/007* (2013.01)

(58) Field of Classification Search
CPC ............ H01L 33/007; H01L 21/02664; H01L 29/0661; H01L 21/02381; H01L 21/0254; H01L 21/02428
See application file for complete search history.

(56) References Cited

U.S. PATENT DOCUMENTS

| 2002/0028343 A1* | 3/2002 | Shibata | ............... H01L 21/0242 |
| | | | 428/602 |
| 2004/0009649 A1* | 1/2004 | Kub | ....................... B82Y 30/00 |
| | | | 438/459 |

(Continued)

FOREIGN PATENT DOCUMENTS

| JP | 4-34931 A | 2/1992 |
| JP | 5-315305 A | 11/1993 |

(Continued)

OTHER PUBLICATIONS

"Production of III-Nitride films for LED and Laser Applications by Multiwafer MOPVE", authors by R. Beccard, B. Wachtendorf, O. Schon, D. Schmitz and H. Jurgensen; vol. 0-7803-3895-2/97, 1997 IEEE.*

(Continued)

*Primary Examiner* — Bilkis Jahan
*Assistant Examiner* — Nga Doan
(74) *Attorney, Agent, or Firm* — Leydig, Voit & Mayer, Ltd.

(57) ABSTRACT

A method for manufacturing a semiconductor device includes: preparing a Si substrate having a flat portion with flat front and back surfaces and a bevel portion located at a periphery of the flat portion; forming a III-V nitride semiconductor film on the front surface of the Si substrate by epitaxial growth; and after forming the III-V nitride semiconductor film, grinding the Si substrate from the back surface. Amounts of working at the bevel portion on the front surface and the back surface of an outermost end portion of the bevel portion are asymmetrical. A first thickness measured from the front surface of the flat portion to the outermost end portion is smaller than a second thickness measured from the back surface of the flat portion to the outermost end portion.

6 Claims, 4 Drawing Sheets

(56) References Cited

U.S. PATENT DOCUMENTS

| | | | |
|---|---|---|---|
| 2004/0113236 A1* | 6/2004 | Kurita | H01L 21/02021 257/620 |
| 2008/0003830 A1* | 1/2008 | Qing | H01L 21/02087 438/694 |
| 2009/0325378 A1* | 12/2009 | Koschinsky | H01L 21/76841 438/653 |
| 2011/0146703 A1 | 6/2011 | Chen et al. | |

FOREIGN PATENT DOCUMENTS

| | | |
|---|---|---|
| JP | 8-316112 A | 11/1996 |
| JP | 9-181349 A | 7/1997 |
| JP | 2001-230166 A | 8/2001 |
| JP | 2005-243727 A | 9/2005 |
| JP | 2005-251961 A | 9/2005 |

OTHER PUBLICATIONS

"Mechanical Wafer Engineering for High Efficiency Solar Cells: An Investigation of the Induced Surface Damages", authors by P.Fath, G. Willeke, E. Bucher, University of Konstanz, Faculty of Physics; vol. CH3365-4/94/0000-1347, 1994 IEEE.*

Taiwan Patent Office; Office Action in Taiwanese Patent Application No. 10421107120 (Aug. 20, 2015).

Korean Patent Office; Office Action in Korean Patent Application No. 10-2014-0082373 (Mar. 15, 2016).

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device wherein a III-V group nitride semiconductor film is epitaxial grown on a Si substrate.

2. Background Art

Epitaxial growth of a III-V group nitride semiconductor film, particularly $Al_xGa_yIn_zN$ (x+y+z=1, y≠0) film as an electronics/optoelectronics material has been proposed (see, for example, Japanese Patent Laid-Open No. 2005-243727). As a method of epitaxially growing this AlGaInN film, a metal organic chemical vapor deposition (MOCVD) is known.

Sapphire substrates have widely been used for epitaxial growth of GaN by MOCVD. However, sapphire substrates have a low degree of lattice matching with GaN and have a thermal expansion coefficient different from that of GaN, and attempts to improve the crystalinity of GaN were unsuccessful in the past. In recent years, after the establishment of a low-temperature buffer layer technique, the crystalinity of GaN has been improved and the development of device manufacturing techniques mainly for blue and white LEDs has advanced remarkably.

However, it is difficult to further improve the crystalinity in terms of dislocation reduction effect and so on. Sapphire itself has low heat conductivity, and heat cannot be sufficiently released from a device using sapphire, resulting in a deterioration in performance of the device. Therefore, hopes are being consistently put on other substrate materials. SiC having a high degree of lattice matching and stable even at a high temperature is one of candidates for use as a suitable substrate. With SiC, while its quality has been improved in recent years, there are problems that its price is high and it is difficult to increase the wafer diameter, as well as crystal quality problems such as micropipes.

In contrast, an effect of increasing the wafer diameter and an effect of reducing dislocations have been achieved for Si substrates, and Si substrates are steadily available at a low price. However, there is a lattice matching problem and a thermal expansion coefficient difference problem with Si substrates and GaN. In a case where a low-temperature AlN buffer layer and a GaN are successively grown on a sapphire substrate and the temperature of the substrate is thereafter returned to room temperature, compressive stress acts in the GaN layer on the sapphire substrate, so that a crack is not easily caused in the substrate. In a case where these layers are formed on a Si substrate in the same way, a tensile stress acts in the GaN layer and, therefore, a crack can easily be caused in the Si substrate. Further, there is, for example, a melt-back etching problem relating to the reaction between Ga (or GaN) and Si. In spite of many problems including those described above, a practical level of use of Si substrates has been reached with the advancement of techniques including multilayer buffer techniques in recent years.

SUMMARY OF THE INVENTION

In manufacture of a semiconductor device, a III-V nitride semiconductor film is epitaxially grown by metal organic chemical vapor deposition, and the wafer is thinned by backgrinding. As backgrinding progresses, however, part of the III-V nitride semiconductor film on a bevel portion (the end surface and a peripheral sloped portion of the wafer) is exposed and comes off. Pieces of the III-V nitride semiconductor film that have come off are involved in grinding to locally grind the wafer. Chippings are thereby generated and the outer periphery of the wafer is chipped, resulting in a deterioration in productivity.

In view of the above-described problems, an object of the present invention is to provide a method for manufacturing a semiconductor device which can improve the productivity.

According to the present invention, a method for manufacturing a semiconductor device includes: preparing a Si substrate having a flat portion with flat front and back surfaces and a bevel portion provided on a periphery of the flat portion; forming a III-V nitride semiconductor film on the front surface of the Si substrate by epitaxial growth; and after forming the III-V nitride semiconductor film, grinding the Si substrate from the back surface. Amounts of working for the bevel portion on the front surface side and the back surface side of an outermost end portion of the bevel portion are asymmetrical. A thickness from the front surface of the flat portion to the outermost end portion is smaller than a thickness from the back surface of the flat portion to the outermost end portion.

The present invention makes it possible to improve the productivity.

Other and further objects, features and advantages of the invention will appear more fully from the following description.

DETAILED DESCRIPTION OF THE PREFERRED EMBODIMENTS

A method for manufacturing a semiconductor device according to the embodiments of the present invention will be described with reference to the drawings. The same components will be denoted by the same symbols, and the repeated description thereof may be omitted.

First Embodiment

Figure 1:
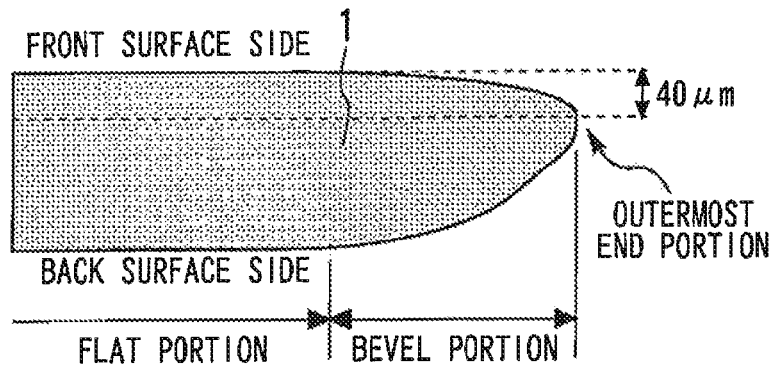
FIGS. 1 and 2 are sectional views showing the method of manufacturing a semiconductor device according to the first embodiment of the present invention.
Figure 2:
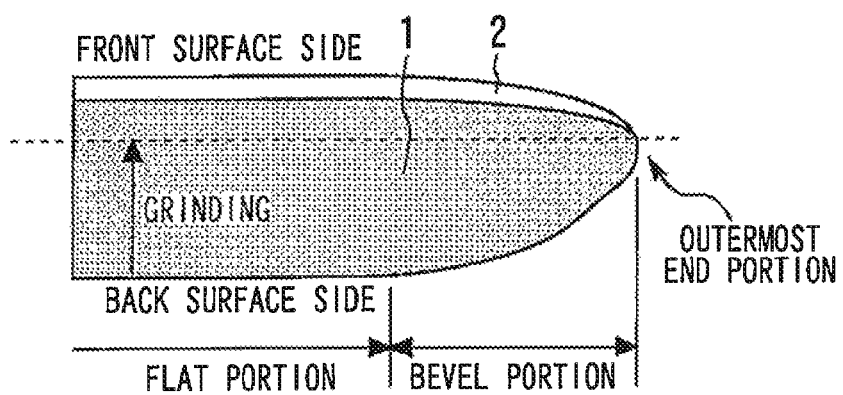

A method of manufacturing a semiconductor device according to a first embodiment of the present invention will be described with reference to the drawings. FIGS. 1 and 2 are sectional views showing the method of manufacturing a semiconductor device according to the first embodiment of the present invention.

First, as shown in FIG. 1, a Si substrate 1 having a flat portion with flat front and back surfaces and a bevel portion provided on the periphery of the flat portion is prepared. The amounts of working for the bevel portion on the front surface side and the back surface side of the outermost end portion of the bevel portion are asymmetrical. The thickness from the front surface of the flat portion to the outermost end portion is smaller than the thickness from the back surface of the flat portion to the outermost end portion, and is, for example, 40 µm or less.

Next, as shown in FIG. 2, an $Al_xGa_yIn_zN$ (x+y+z=1, y≠0) film 2, which is an example of a III-V nitride semiconductor film, is epitaxially grown on the front surface of the Si substrate 1 by MOCVD. In this growth, the deposition of the $Al_xGa_yIn_zN$ film 2 is stopped at the outermost end portion and epitaxial growth does not take place in the region below the outermost end portion.

More specifically, the Si substrate 1 placed on a susceptor heated to a predetermined temperature by a heating device is held in a reaction furnace. Trimethylaluminum, trimethylgallium, trimethylindium, or a mixture gas consisting of two or more of these metal organic gases and ammonia provided as a nitrogen raw material are introduced from a gas introduction section into the reaction furnace together with a carrier gas such as hydrogen or nitrogen, and the $Al_xGa_yIn_zN$ film 2 is deposited on the Si substrate 1 by the reaction between the metal organic gases and ammonia. For example, in a case where a field effect transistor (FET) is made on the Si substrate 1, an AlGaN buffer layer having a layer thickness of 1.5 µm, a GaN electron travel layer having a layer thickness of 1.0 µm and an $Al_{0.2}Ga_{0.8}N$ electron supply layer having a layer thickness of 25 nm are successively deposited by epitaxial growth. Subsequently, electrodes and wiring are formed.

Next, the Si substrate 1 is grinded from the back surface. Grinding of the Si substrate 1, however, does not reach any point beyond the outermost end portion in the thickness direction. For example, the Si substrate 1 is worked into a thin plate having a thickness of 40 µm. Finally, dicing, die bonding, wire bonding and packaging are performed to complete the semiconductor device.

Figure 3:
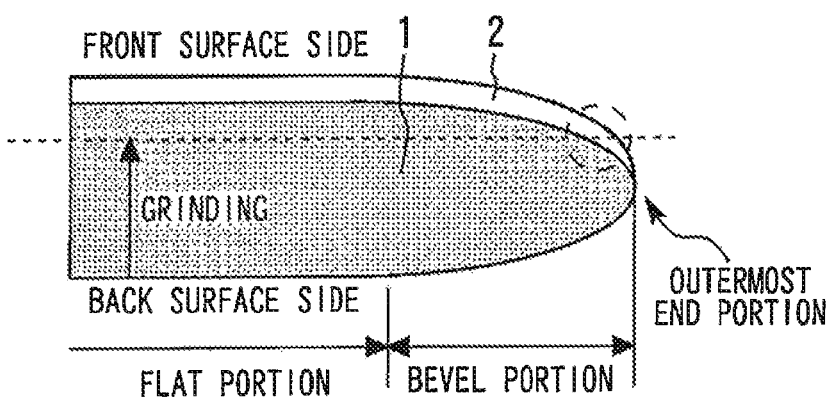
FIG. 3 is a sectional view showing a method of manufacturing a semiconductor device according to the comparative example.

The effects of the present embodiment will be described in comparison with a comparative example. FIG. 3 is a sectional view showing a method of manufacturing a semiconductor device according to the comparative example. In the comparative example, the amounts of working for the bevel portion on the front surface side and the back surface side are symmetrical. Therefore, as backgrinding progresses, part of the $Al_xGa_yIn_zN$ film 2 on the bevel portion is exposed and comes off. Pieces of the $Al_xGa_yIn_zN$ film 2 that have come off are involved in grinding to locally grind the Si substrate 1. Chippings are thereby generated and the outer periphery of the Si substrate 1 is chipped, resulting in a deterioration in productivity.

In contrast, in the present embodiment, the amounts of working for the bevel portion on the front surface side and the back surface side are asymmetrical, and the thickness from the front surface of the flat portion to the outermost end portion is smaller than the thickness from the back surface of the flat portion to the outermost end portion. Therefore, even when backgrinding progresses, the $Al_xGa_yIn_zN$ film 2 is not easily exposed, thus suppressing the generation of chippings and improving the productivity.

Second Embodiment

A method of manufacturing a semiconductor device according to a second embodiment of the present invention will be described with reference to the drawings. FIGS. 4 to 9 are sectional views showing the method of manufacturing a semiconductor device according to the second embodiment of the present invention.

Figure 4:
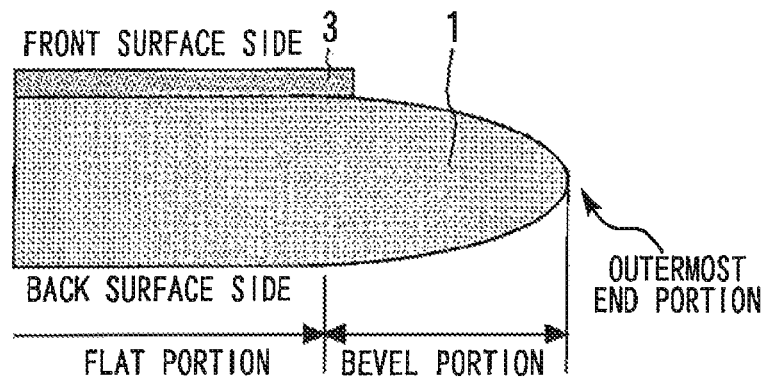
FIGS. 4 to 9 are sectional views showing the method of manufacturing a semiconductor device according to the second embodiment of the present invention.

First, as shown in FIG. 4, a Si substrate 1 having a flat portion with flat front and back surfaces and a bevel portion provided on the periphery of the flat portion is prepared. The flat portion is then covered with a mask 3.

Figure 5:
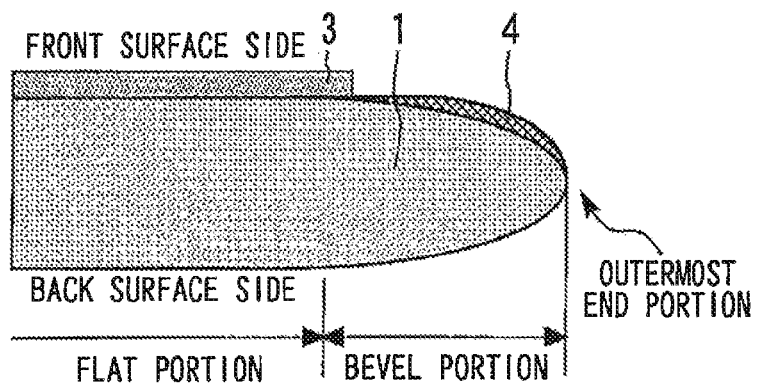
Figure 6:
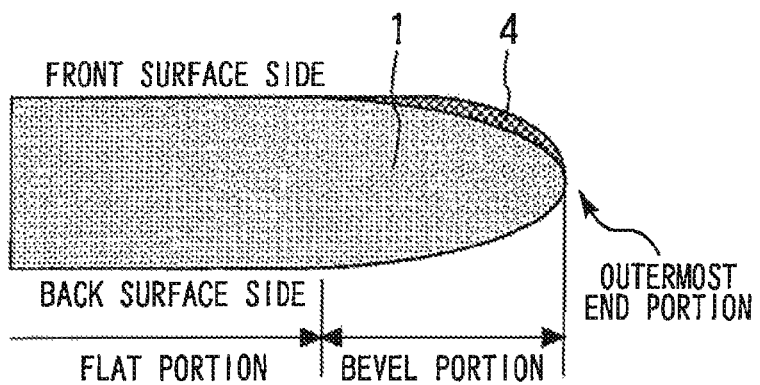

Next, as shown in FIG. 5, an oxide film 4 is formed on the front surface side of the bevel portion of the Si substrate 1 by using thermal CVD. The thickness of the oxide film 4 is 2.5 µm. The mask 3 is thereafter removed, as shown in FIG. 6.

Figure 7:
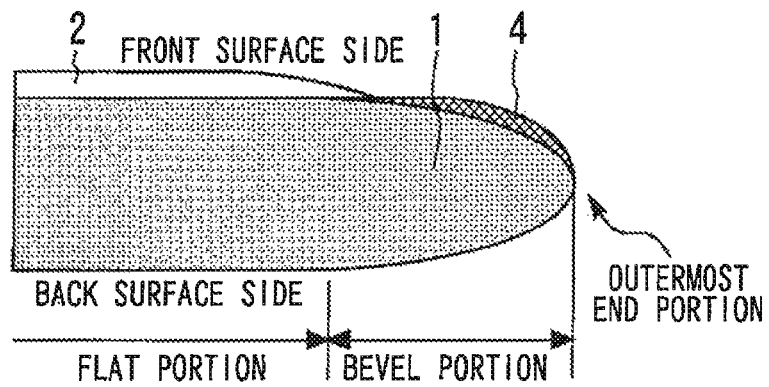
Figure 8:
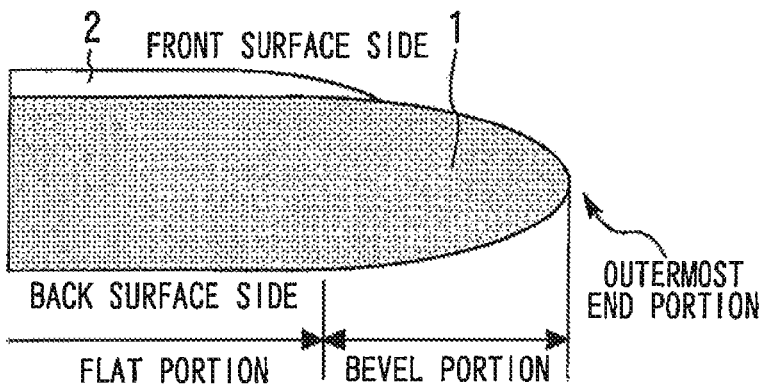
Figure 9:
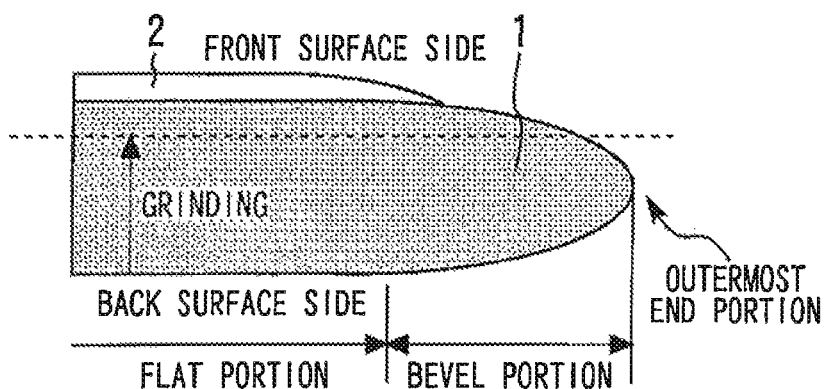

Next, as shown in FIG. 7, $Al_xGa_yIn_zN$ film 2 is epitaxially grown on the front surface of the Si substrate 1 by using MOCVD. For example, in a case where a field effect transistor is made on the Si substrate 1, the same making flow as that in the first embodiment is performed. The oxide film 4 is thereafter removed, as shown in FIG. 8. Next, as shown in FIG. 9, the Si substrate 1 is grinded from the back surface.

As described above, the oxide film 4 is formed on the font surface side of the bevel portion to inhibit the epitaxial growth of the $Al_xGa_yIn_zN$ film 2 on the front surface side of the bevel portion. Therefore, even when backgrinding progresses, the $Al_xGa_yIn_zN$ film 2 is not easily exposed, thus suppressing the generation of chippings and improving the productivity.

It is desirable to set the thickness of the oxide film 4 equal to or larger than the thickness of the $Al_xGa_yIn_zN$ film 2 in order to prevent the epitaxial growth of the $Al_xGa_yIn_zN$ film 2 on the front surface side of the bevel portion. For example, when the thickness of the $Al_xGa_yIn_zN$ film 2 is 1.0 µm, the thickness of the oxide film 4 is also set to 1.0 µm.

Third Embodiment

Figure 10:
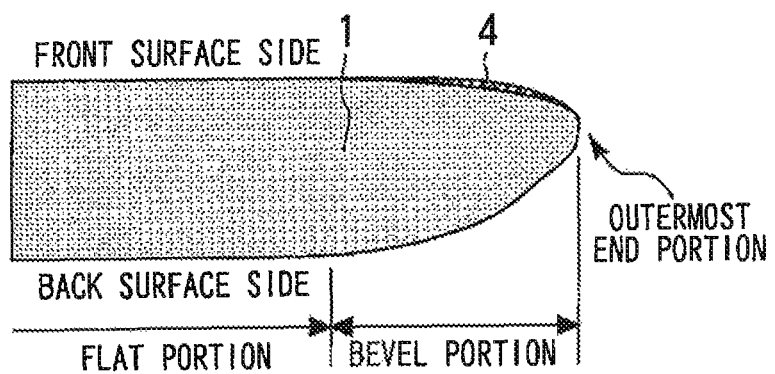
FIGS. 10 and 11 are sectional views showing the method of manufacturing a semiconductor device according to the third embodiment of the present invention.
Figure 11:
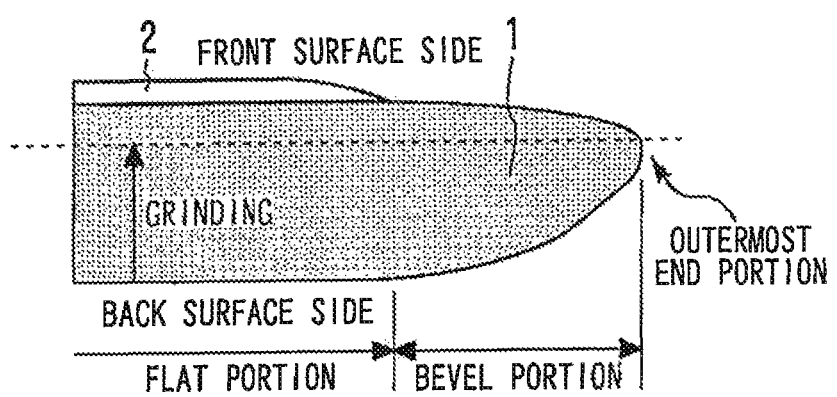

A method of manufacturing a semiconductor device according to a third embodiment of the present invention will be described with reference to the drawings. FIGS. 10 and 11 are sectional views showing the method of manufacturing a semiconductor device according to the third embodiment of the present invention.

First, as shown in FIG. 10, a Si substrate 1 having a flat portion with flat front and back surfaces and a bevel portion provided on the periphery of the flat portion is prepared. The amounts of working for the bevel portion on the front surface side and the back surface side of the outermost end portion of the bevel portion are asymmetrical. The thickness from the front surface of the flat portion to the outermost end portion is smaller than the thickness from the back surface of the flat portion to the outermost end portion, and is, for example, 40 µm or less. Oxide film 4 is formed on the front surface side of the bevel portion by using thermal CVD, as in the case of the second embodiment.

Next, $Al_xGa_yIn_zN$ film 2 is epitaxially grown on the front surface of the Si substrate 1 by using MOCVD, as in the case of the second embodiment. For example, in a case where a field effect transistor is made on the Si substrate 1, the same making flow as that in the first embodiment is performed. The oxide film 4 is thereafter removed. Next, as shown in FIG. 11, the Si substrate 1 is grinded from the back surface.

In the present embodiment, the amounts of working for the bevel portion on the front surface side and the back surface side are asymmetrical, as in the case of the first embodiment, and the thickness from the front surface of the flat portion to the outermost end portion is smaller than the thickness from the back surface of the flat portion to the outermost end portion, as in the case of the first embodiment. Further, the oxide film 4 is formed on the font surface side of the bevel portion, as in the case of the second embodiment, thereby inhibiting the epitaxial growth of the $Al_xGa_yIn_zN$ film 2 on the front surface side of the bevel portion. Therefore, even when backgrinding progresses, the $Al_xGa_yIn_zN$ film 2 is not easily exposed, thus suppressing the generation of chippings and improving the productivity.

It is desirable to set the thickness of the oxide film 4 equal to or larger than the thickness of the $Al_xGa_yIn_zN$ film 2 in order to prevent the epitaxial growth of the $Al_xGa_yIn_zN$ film 2 on the front surface side of the bevel portion. For example, when the thickness of the $Al_xGa_yIn_zN$ film 2 is 1.0 µm, the thickness of the oxide film 4 is also set to 1.0 µm.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-145643, filed on Jul. 11, 2013 including specification, claims, drawings and summary, on which the Convention priority of the present application is based, is incorporated herein by reference in its entirety.

What is claimed is:

1. A method for manufacturing a semiconductor device comprising:
    preparing a Si substrate including
        a flat portion having mutually opposed flat front and flat back surfaces, wherein the flat front and flat rear surfaces are separated by a thickness of the flat portion that is measured transverse to the flat front and flat rear surfaces, and
        a bevel portion located at and extending outwardly from a periphery of the flat portion, wherein
            the bevel portion includes an outermost end portion that is located more distant from the flat portion than any other part of the bevel portion,
            a first thickness of the flat portion is measured (i) from a first plane that is generally parallel to the flat front surface and that intersects the outermost end portion closest to the flat front surface, (ii) to the flat front surface,
            a second thickness of the flat portion is measured (iii) from a second plane that is generally parallel to the flat back surface and that intersects the outermost end portion closest to the flat back surface, (iv) to the flat back surface, and
            the first thickness is smaller than the second thickness;
    epitaxially growing a III-V nitride semiconductor film on the flat front surface of the Si substrate; and
    after epitaxially growing the III-V nitride semiconductor film, grinding and removing part of the Si substrate from the flat back surface of the Si substrate.

2. The method for manufacturing the semiconductor device according to claim 1, including stopping grinding and removing of part of the Si substrate from the flat back surface of the Si substrate before reaching the first plane.

3. The method for manufacturing the semiconductor device according to claim 2, wherein the first thickness is no more than 40 µm.

4. The method for manufacturing the semiconductor device according to claim 1, comprising:
    after preparing the Si substrate and before epitaxially growing the III-V nitride semiconductor film, forming an oxide film on a side of the bevel portion that is closer to the flat front surface than to the flat back surface; and
    after epitaxially growing the III-V nitride semiconductor film and before grinding and removing part of the Si substrate, removing the oxide film.

5. The method for manufacturing the semiconductor device according to claim 4, including forming the oxide film to an oxide film thickness and epitaxially growing the III-V nitride semiconductor film to a semiconductor film thickness that is equal to or smaller than the oxide film thickness.

6. The method for manufacturing the semiconductor device according to claim 1, epitaxially growing $Al_xGa_yIn_zN$ ($x+y+z=1$, $y\neq0$) as the III-IV nitride semiconductor film.

* * * * *